United States Patent
Werner et al.

(10) Patent No.: US 6,803,609 B1
(45) Date of Patent: Oct. 12, 2004

(54) BIPOLAR HIGH-VOLTAGE POWER COMPONENT

(75) Inventors: Wolfgang Werner, München (DE); Frank Pfirsch, München (DE)

(73) Assignee: Infineon Technologies AG, Munich (DE)

( * ) Notice: Subject to any disclaimer, the term of this patent is extended or adjusted under 35 U.S.C. 154(b) by 32 days.

(21) Appl. No.: 09/603,748

(22) Filed: Jun. 26, 2000

Related U.S. Application Data

(63) Continuation of application No. PCT/DE99/03404, filed on Oct. 25, 1999.

(30) Foreign Application Priority Data

Oct. 26, 1998 (DE) .......................... 198 49 332

(51) Int. Cl.$^7$ ...................... H01L 29/74; H01L 31/111
(52) U.S. Cl. ................................................. 257/107
(58) Field of Search ........................... 257/122, 141, 257/162, 163, 164, 165, 343, 423, 556, 557, 119, 120, 121, 222, 123, 124, 125, 126, 127, 128, 129, 130, 131; 438/316, 325, 335, 204, 236

(56) References Cited

U.S. PATENT DOCUMENTS

| | | | | |
|---|---|---|---|---|
| 4,967,244 A | * | 10/1990 | Bauer ........................ 357/23 |
| 5,323,029 A | * | 6/1994 | Nishizawa .................. 257/136 |
| 5,705,835 A | * | 1/1998 | Nishiura et al. ........... 257/147 |
| 5,801,420 A | * | 9/1998 | Fujishima ................... 257/343 |
| 5,894,140 A | * | 4/1999 | Terasawa .................... 257/147 |
| 6,084,263 A | * | 7/2000 | Tsuchitani et al. ......... 257/328 |
| 6,147,381 A | * | 11/2000 | Hirler et al. ............... 257/328 |

FOREIGN PATENT DOCUMENTS

DE         196 04 043 A1     8/1997

OTHER PUBLICATIONS

Published International Application No. WO 98/38681 (Pfirsch et al.), dated Sep. 3, 1998.

* cited by examiner

Primary Examiner—Wael Fahmy
Assistant Examiner—Dana Farahani
(74) Attorney, Agent, or Firm—Laurence A. Greenberg; Werner H. Stemer; Gregory L. Mayback

(57) ABSTRACT

A bipolar high-voltage power component, in particular an IGBT, includes a semiconductor body on which at least two mutually spaced apart electrodes are provided, between which a drift path is formed in a semiconductor region of a first conduction type. Floating zones of a second conduction type, opposite the first conduction type, are provided in the semiconductor region. When the power component is switched on or switched off, the floating zones respectively emit charge carriers of the second conduction type into the semiconductor region or take up the charge carriers from the semiconductor region. The floating zones are connected, through a respective MOS transistor with a channel of the second conduction type or a bipolar transistor with a base of the first conduction type, to active regions of the power component which are connected to the two electrodes.

17 Claims, 3 Drawing Sheets

BIPOLAR HIGH-VOLTAGE POWER COMPONENT

This application is a continuation of PCT/DE99/03404 filed Oct. 25, 1999.

BACKGROUND OF THE INVENTION

Field of the Invention

The present invention relates to a bipolar high-voltage power component having a semiconductor body on which at least two mutually spaced apart electrodes are provided, between which a drift path is formed in a semiconductor region of a first conduction type.

In the case of bipolar semiconductor components such as, for example, diodes, bipolar transistors or IGBTs (Insulated Gate Bipolar Transistors), their dynamic response is determined to a very great extent by the minority charge carriers present in the drift path, that is to say in the base, in the case of a bipolar transistor. That is because the smaller the base width, the higher the limiting frequency that can ultimately be achieved.

It has recently become possible to reduce the base width of bipolar transistors down to approximately 30 nm, which leads to the aforementioned reduction in stored minority charge carriers in the base, so that an increase in the limiting frequency would be possible. Thus, it has been shown that when the base width of bipolar transistors is reduced down to about 30 nm, the quantity of stored minority charge carriers in the base and/or the diffusion capacitance can be reduced, which ultimately leads to a corresponding increase in the limiting frequency up to approximately 50 GHz, but at the same time the dielectric strength is reduced to a few volts.

In the case of high-voltage power components such as IGBTs, for example, across which there may be a voltage of up to several kV, or in the case of diodes, the base width is inherently determined by the required dielectric strength and the structure of the high-voltage power components. However, it is the case quite generally that the minority charge carriers stored in the drift zone, that is to say the minority charge carriers stored in the base zone in the case of a bipolar transistor, limit the maximum operating frequency or give rise to dynamic losses when the component is switched on and off.

Although it is possible to reduce dynamic losses in bipolar high-voltage power components by reducing the quantity of stored minority charge carriers by reducing the emitter efficiency in the case of an IGBT, for example, such a procedure nonetheless inevitably leads to an increase in static losses. It is also possible to reduce the lifetime of charge carriers by doping with a corresponding lifetime killer, that is to say, for example, gold or platinum, or by electron or helium irradiation, whereby dynamic losses can be reduced.

However, such a procedure also leads to a simultaneous increase in the static losses.

SUMMARY OF THE INVENTION

It is accordingly an object of the invention to provide a bipolar high-voltage power component, which overcomes the hereinafore-mentioned disadvantages of the heretofore-known devices of this general type and in which, despite a relatively large drift path, switching losses are considerably reduced and thus possible operating frequencies are considerably increased, without adversely affecting on-state properties of the bipolar high-voltage power component.

With the foregoing and other objects in view there is provided, in accordance with the invention, a bipolar high-voltage power component, comprising a semiconductor body having a semiconductor region of a first conduction type; at least two mutually spaced apart electrodes disposed on the semiconductor body and forming a drift path between the electrodes in the semiconductor region; and floating zones of a second conduction type opposite the first conduction type, the floating zones preferably disposed in the semiconductor region and extending from the vicinity of one of the at least two electrodes as far as the vicinity of another of the at least two electrodes, the floating zones respectively emitting charge carriers of the second conduction type into the semiconductor region or taking up the charge carriers of the second conduction type from the semiconductor region, when the power component is respectively switched on or switched off.

Therefore, in the case of the bipolar high-voltage power component according to the invention, a "compromise" between dynamic and static losses (with the dielectric strength unchanged) is avoided. To that end, floating zones of the second conduction type, that is to say p-conducting zones, are inserted by diffusion or implantation into the semiconductor region of the first conduction type, that is to say, for example, to an n-conducting drift path of a bipolar transistor. These floating zones, which can also be referred to as "p-type pillars" in the case of an n-conducting semiconductor region, have the task of introducing the minority charge carriers, that is to say holes in the present example, through "ohmic conduction" into the semiconductor regions situated between the floating zones, or of conducting away those minority charge carriers from the semiconductor regions.

It has been shown that this operation, namely the introduction of minority charge carriers into the semiconductor regions from the floating zones during switch-on and the removal of the minority charge carriers from the semiconductor regions into the floating zones during switch-off, can take place much more quickly than the build up and the reduction of the minority charge carrier density by diffusion.

In accordance with another feature of the invention, the floating zones are connected, through a respective MOS transistor with a channel of the second conduction type or a bipolar transistor with a base of the first conduction type, to active regions of the power component which are connected to the two electrodes. Thus, by way of example, in the case of an IGBT with an n-conducting semiconductor region as a drift path, p-conducting pillars are connected through a pnp transistor to the emitter or the anode of the IGBT and through a p-MOS transistor to the channel or body region of the IGBT. When the IGBT is switched on, the holes are then transported through the pnp transistor and the p-conducting pillars into the drift path, while in the event of switch-off, the p-MOS transistor is switched on, with the result that the minority charge carriers, that is to say the holes, can flow away from the n-conducting semiconductor region through the p-conducting pillars as majority charge carriers and the p-MOS transistor.

In accordance with a further feature of the invention, the MOS transistor is to be connected together with a further MOS transistor containing the corresponding active region. In this case, in particular, the gates of the two MOS transistors can be connected to one another. In the above example, then, the gate of the p-MOS transistor, through which the minority charge carriers flow away from the drift path, is connected to the gate of an n-MOS transistor.

In accordance with an added feature of the invention, depending on the operating frequency, it may then be expedient, in order to reduce the switch-off losses, to switch e the p-MOS transistor on first and then switch the n-MOS transistor off with a delay of 1 $\mu$s, for example. This delay can be achieved by separate driving or else by a delay element, for example a high-value resistor between the two gates. In this case, the delay element may also be integrated in the semiconductor chip of the bipolar high-voltage power component.

In accordance with an additional feature of the invention, the dopings of the semiconductor region and of the floating zones are set in such a way that the semiconductor region and the semiconductor zones "compensate" one another, in order thus to be able to achieve high reverse voltages. Dopings of between $5\times10^{14}$ and $5\times10^{16}$ charge carriers cm$^{-3}$ are preferably chosen in this case.

However, it is not essential in this case to achieve the highest possible n-type doping in, for example, an n-conducting semiconductor region as in the case of a unipolar transistor. Instead, the resistance of the floating semiconductor zones, that is to say of the p-conducting pillars in the above example, should be matched in such a way that the holes flow away sufficiently rapidly at a voltage that is still low. This is because the charge carrier flooding, which is necessary for good conductivity in the on state, is then made available by the p-conducting emitter and is not adversely influenced by the p-conducting pillars, since these p-conducting pillars are not connected to an extracting p-conducting region in on-state operation, which occurs only during switch-off by the p-MOS transistor.

In accordance with yet another feature of the invention, the invention can be applied with particular advantage to an IGBT since, in this case, particularly high flooding with charge carriers occurs. The charge carriers can then immediately be removed through the floating zones. It has been shown that an IGBT constructed according to the present invention has switch-off losses reduced by up to 80% as compared with conventional IGBTs, given the same forward voltage. Even when compared with a so-called "field stop IGBT", the switch-off losses can still be halved by the invention.

In accordance with a concomitant feature of the invention, further possibilities for application of the bipolar high-voltage power component according to the invention are diodes, for example. In diodes, the floating regions can also be connected directly to the p-conducting region of the anode, so that an additional p-MOS transistor is not required.

Other features which are considered as characteristic for the invention are set forth in the appended claims.

Although the invention is illustrated and described herein as embodied in a bipolar high-voltage power component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
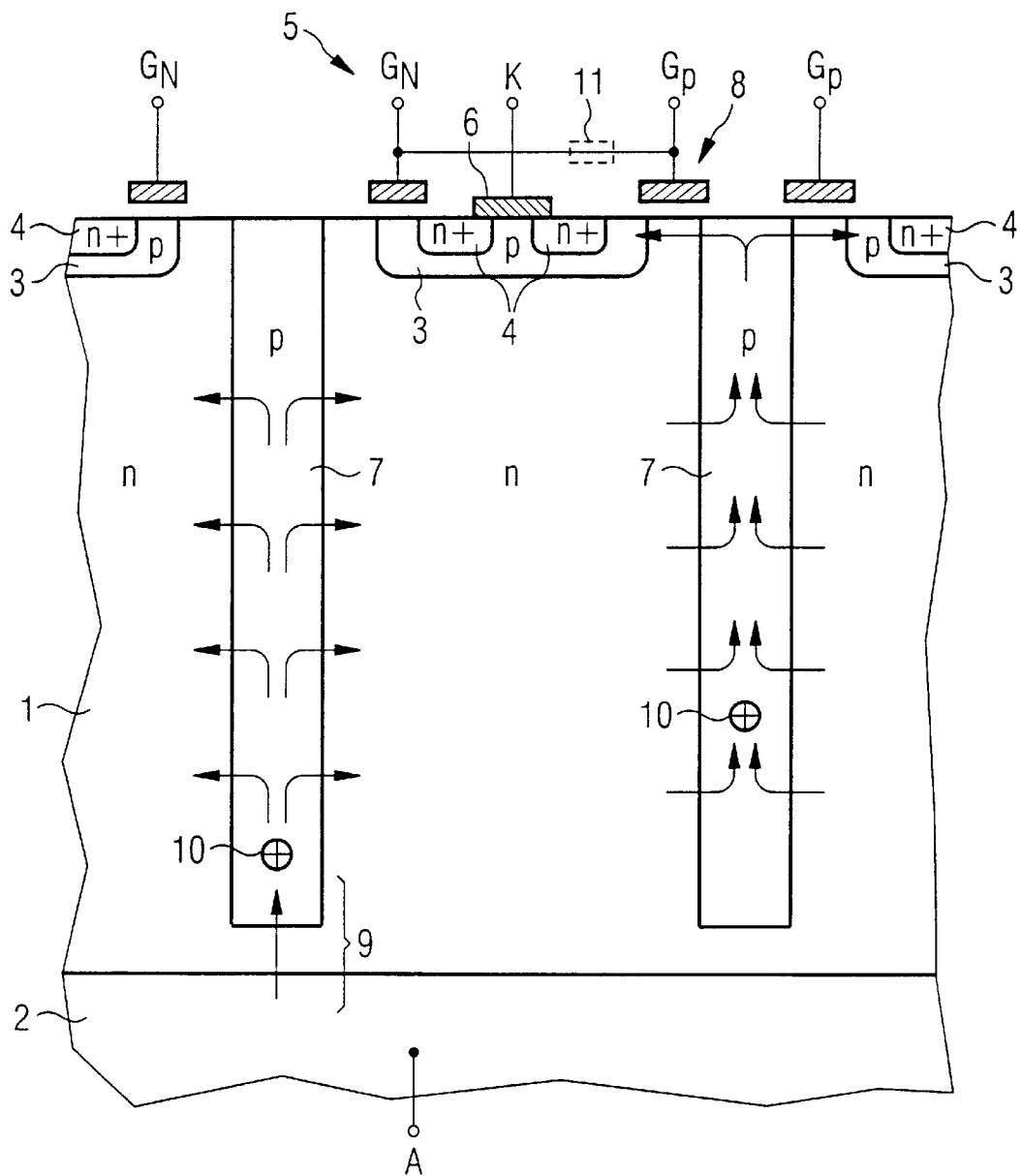
FIG. 1 is a fragmentary, diagrammatic, sectional view of an IGBT according to a first exemplary embodiment of the invention.

Referring now to the figures of the drawings in detail and first, particularly, to FIG. 1 thereof, there is seen a section through an IGBT with an n-conducting semiconductor region 1 on a p$^+$-conducting semiconductor substrate 2, which forms an emitter connected to an anode A. It can be seen from the figure that p-conducting semiconductor regions 3 are introduced in a surface of the semiconductor region 1 which is opposite the semiconductor substrate 2. It is also seen that n$^+$-conducting source zones 4 are situated in the semiconductor regions 3.

The semiconductor substrate 2, the semiconductor body 1, the semiconductor region 3 and the source zones 4 are preferably composed of silicon. If appropriate, however, it is also possible to use other semiconductor materials.

The source zones 4 and the semiconductor region 3 along with the semiconductor body 1 form an n-MOS transistor 5 with a gate electrode $G_N$ disposed above the semiconductor region 3 (body). Moreover, it is additionally seen that a cathode electrode 6 has a cathode connection K and makes contact with the semiconductor region 3 and the source zones 4.

According to the invention, the semiconductor region 1 contains p-conducting zones 7, which are preferably floating, that is to say they are not connected to the semiconductor region 3.

A p-MOS transistor 8 is formed by the floating semiconductor zone 7, which is on the right in FIG. 1, together with a gate electrode $G_P$, the semiconductor region 3 and a part of the semiconductor region 1 which is located between the semiconductor region 3 and the floating zone 7. Moreover, a pnp transistor 9 is formed by the floating semiconductor zone 7 which is on the left in FIG. 1, along with the semiconductor region 1 and the semiconductor substrate 2.

The floating zones 7 have the task of introducing minority charge carriers, holes in the present example, through ohmic conduction into the regions of the n-conducting semiconductor body 1 which are situated between the p-conducting zones 7, and of conducting them away from there. In this case, these floating zones 7 are connected through the pnp-transistor 9 to the p-conducting emitter or the anode A of the IGBT and through the p-MOS transistor 8 to the semiconductor region 3 (body). Instead of the MOS transistor 8 and the pnp transistor 9, it is also possible to respectively use a bipolar transistor (for the MOS transistor 8) or a MOS transistor (for the bipolar transistor 9) in each case.

A channel region of the MOS transistor 5 simultaneously forms a drain or collector region of the respective MOS or bipolar transistor 8.

When the IGBT is switched on (see the left-hand half of FIG. 1), the holes (see reference symbol 10) are then transported through the pnp transistor 9 and the zone 7 into a drift path of the semiconductor region 1. In the event of switch-off (see the right-hand half of FIG. 1), the p-MOS transistor 8 is switched on, with the result that the minority charge carriers can flow away from the semiconductor region 1 through the zone 7 as majority charge carriers and the p-MOS transistor 8. The flowing-in and flowing-away of the holes 10 in each case are illustrated by arrows in FIG. 1.

Although the switch-on and the switch-off operations are both illustrated in FIG. 1, it goes without saying that only a switch-on operation or a switch-off operation ever takes place simultaneously in the two zones 7. In other words, the conditions shown on the left are present in both of the zones 7 during switch-on, while the conditions illustrated on the right will be encountered during switch-off.

The gate electrodes $G_N$ and $G_P$ of the n-MOS transistor 5 and of the p-MOS transistor 8 can be connected to one another as shown in FIG. 1. If appropriate, there may also be a delay element 11 in a connecting line between the gate electrodes $G_N$ and $G_P$. This makes it possible, in order to reduce the switch-off losses, to switch the p-MOS transistor 8 on first and then switch the n-MOS transistor 5 off with a delay of 1 μs, for example. Instead of a delay element 11, it is also possible, if appropriate, for the two respective gate electrodes $G_P$ and $G_N$ to be driven in a manner staggered over time or separately. The gate electrodes are not connected to one another in that case.

Preferably, the transistors 5, 8 can be driven separately and externally.

The doping concentrations of the semiconductor region 1 and/or of the semiconductor zones 7 are set in such a way that the holes 10 can flow away sufficiently rapidly at a voltage which is still low. Suitable doping concentrations are in the range of between $5 \times 10^{14}$ and $5 \times 10^{16}$ charge carriers $cm^{-3}$.

Figure 2:
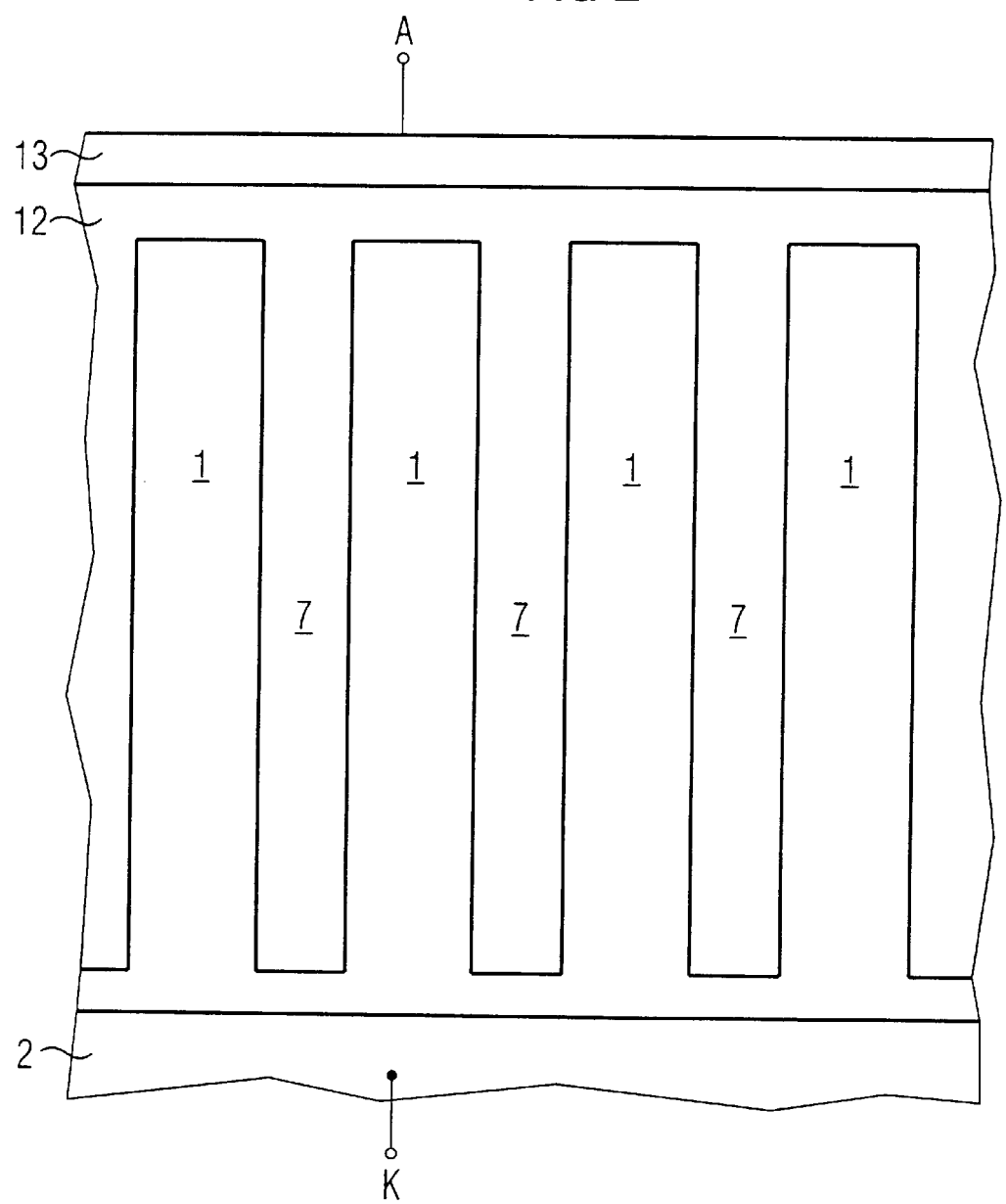
FIG. 2 is a fragmentary, sectional view of a diode according to a second exemplary embodiment of the invention.

FIG. 2 shows a further exemplary embodiment of the invention as a diode in which p-conducting zones 7 are embedded in an n-conducting semiconductor region 1, which are connected directly to a p-conducting region 12 beneath an aluminum layer 13 of an anode A in this case. A cathode K is connected to an $n^+$-conducting semiconductor substrate 2. An additional p-MOS transistor 8 is not necessary with such a configuration.

Figure 3:
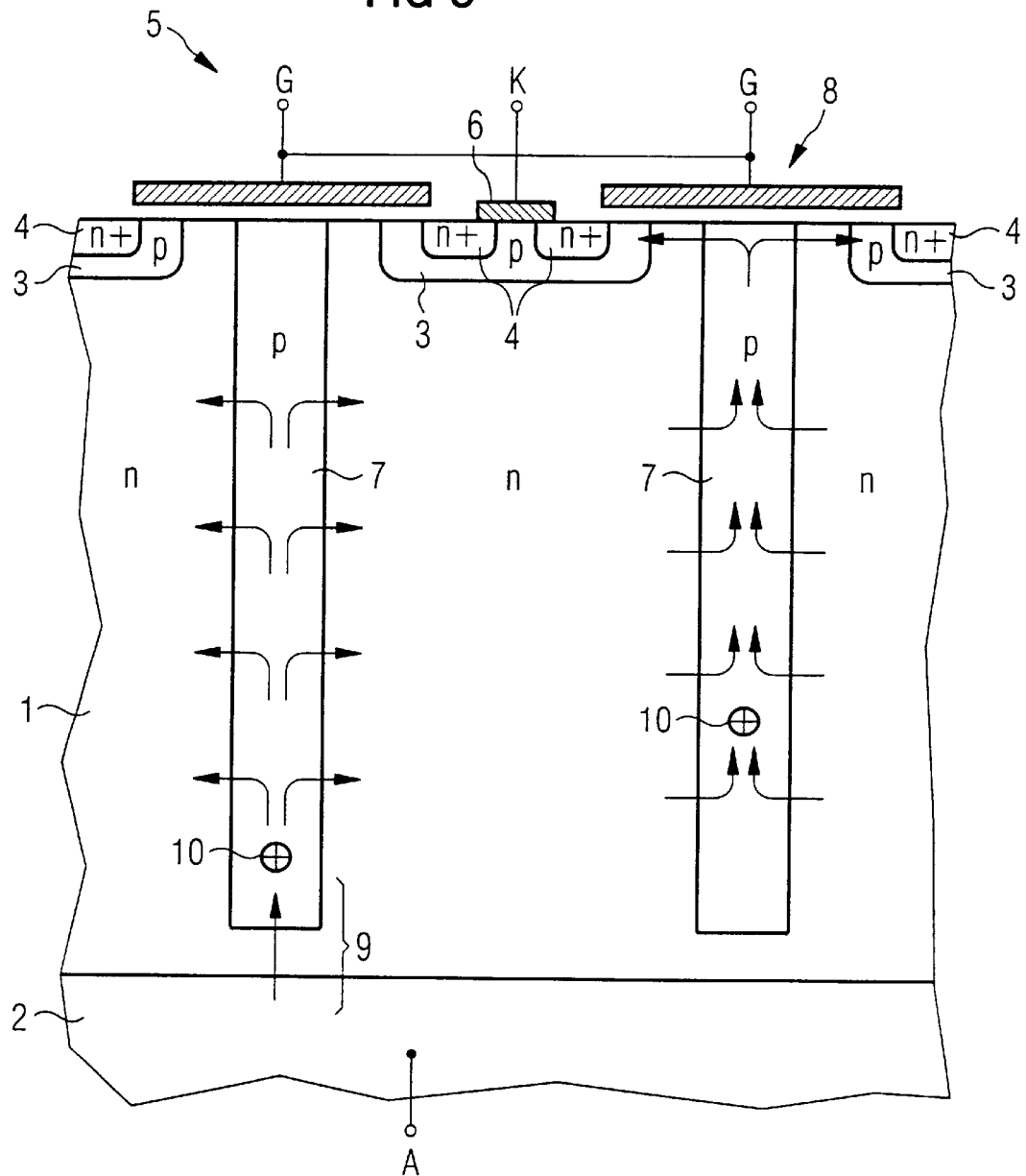
FIG. 3 is a fragmentary, sectional view of an IGBT according to a third exemplary embodiment of the invention.

Finally, FIG. 3 shows another exemplary embodiment of the invention, in which the gates are connected between adjacent IGBT cells, so that $G_P = G_N$.

The bipolar high-voltage power component according to the invention can be constructed vertically or laterally, that is to say the drift path of the first conduction type and the zones 7 of the second conduction type can be disposed essentially parallel or perpendicular to the surface of the semiconductor body 1.

We claim:

1. A bipolar high-voltage power component, comprising:
a semiconductor body having a semiconductor region of a first conduction type;
at least two mutually spaced apart electrodes disposed on said semiconductor body and forming a drift path between said electrodes in said semiconductor region; and
floating zones of a second conduction type opposite the first conduction type, said floating zones disposed in said semiconductor region and extending from the vicinity of one of said at least two electrodes as far as the vicinity of another of said at least two electrodes, said floating zones respectively emitting charge carriers of the second conduction type into said semiconductor region and taking up the charge carriers of the second conduction type from said semiconductor region, when the power component is respectively switched on and switched off.

2. The bipolar high-voltage power component according to claim 1, including active regions connected to said at least two electrodes, and MOS transistors with a channel of the second conduction type, each connected between a respective one of said floating zones and said active regions.

3. The bipolar high-voltage power component according to claim 1, including active regions connected to said at least two electrodes, and bipolar transistors each connected between a respective one of said floating zones and said active regions.

4. The bipolar high-voltage power component according to claim 1, including active regions connected to said at least two electrodes, and bipolar transistors with a base of the first conduction type, each connected between a respective one of said floating zones and said active regions.

5. The bipolar high-voltage power component according to claim 1, including active regions connected to said at least two electrodes, and MOS transistors each connected between a respective one of said floating zones and said active regions.

6. The bipolar high-voltage power component according to claim 1, including a MOS transistor with a channel of the first conduction type for switching the power component on and off.

7. The bipolar high-voltage power component according to claim 1, including a MOS transistor with a channel of the second conduction type, and a MOS transistor with a channel of the first conduction type for switching the power component on and off, said two MOS transistors having interconnected gates.

8. The bipolar high-voltage power component according to claim 7, including a delay element connected between said two MOS transistors.

9. The bipolar high-voltage power component according to claim 7, wherein said two MOS transistors are to be separately and externally driven.

10. The bipolar high-voltage power component according to claim 1, wherein said semiconductor region and said floating zones each have a doping concentration of about $5 \times 10^{14}$ to $5 \times 10^{16}$ charge carriers $cm^{-3}$.

11. The bipolar high-voltage power component according to claim 7, wherein said MOS transistor with a channel of the second conduction type has a drain region and a collector region, and said MOS transistor with a channel of the first conduction type has a channel region which is simultaneously one of the drain and collector regions of said MOS transistor with a channel of the second conduction type.

12. The bipolar high-voltage power component according to claim 6, including a bipolar transistor having a drain region and a collector region, said MOS transistor with a channel of the first conduction type having a channel region which is simultaneously one of the drain and collector regions of said bipolar transistor.

13. The bipolar high-voltage power component according to claim 1, wherein said semiconductor body has a surface, and said drift path of the first conduction type and said floating zones of the second conduction type are disposed substantially parallel to said surface of said semiconductor body.

14. The bipolar high-voltage power component according to claim 1, wherein said semiconductor body has a surface, and said drift path of the first conduction type and said floating zones of the second conduction type are disposed substantially perpendicular to said surface of said semiconductor body.

15. An IGBT, comprising:
a semiconductor body having a semiconductor region of a first conduction type;
at least two mutually spaced apart electrodes disposed on said semiconductor body and forming a drift path between said electrodes in said semiconductor region; and floating zones of a second conduction type opposite the first conduction type, said floating zones disposed in said semiconductor region and extending from the vicinity of one of said at least two electrodes as far as the vicinity of another of said at least two electrodes, said floating zones respectively emitting charge carriers of the second conduction type into said semiconductor region and taking up the charge carriers of the second conduction type from said semiconductor region, when the IGBT is respectively switched on and switched off.

16. A diode, comprising:

a semiconductor body having a semiconductor region of a first conduction type;

at least two mutually spaced apart electrodes disposed on said semiconductor body and forming a drift path between said electrodes in said semiconductor region; and floating zones of a second conduction type opposite the first conduction type, said floating zones disposed in said semiconductor region and extending from the vicinity of one of said at least two electrodes as far as the vicinity of another of said at least two electrodes, said floating zones respectively emitting charge carriers of the second conduction type into said semiconductor region and taking up the charge carriers of the second conduction type from said semiconductor region, when the diode is respectively switched on and switched off.

17. A bipolar high-voltage power component, comprising:

a semiconductor body having a semiconductor region of a first conduction type;

at least two mutually spaced apart electrodes disposed on said semiconductor body and forming a drift path between said electrodes in said semiconductor region;

floating zones of a second conduction type opposite the first conduction type, said floating zones disposed in said semiconductor region and extending from the vicinity of one of said at least two electrodes as far as the vicinity of another of said at least two electrodes, said floating zones respectively emitting charge carriers of the second conduction type into said semiconductor region and taking up the charge carriers of the second conduction type from said semiconductor region, when the power component is respectively switched on and switched off; and a MOS transistor with a channel of the second conduction type, and a MOS transistor with a channel of the firs conduction type for switching the power component on and off;

said two MOS transistors having interconnected gates and having a delay element connected between said two MOS transistors.

* * * * *